US008412292B2

(12) United States Patent
Agassi et al.

(10) Patent No.: US 8,412,292 B2
(45) **Date of Patent: *Apr. 2, 2013**

(54) IMD-SELECTIVE DESIGN OF HTS-BASED FILTERS

(75) Inventors: Yehoshua Dan Agassi, Silver Spring, MD (US); Daniel E. Oates, Belmont, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 260 days.

This patent is subject to a terminal disclaimer.

(21) Appl. No.: 12/837,544

(22) Filed: Jul. 16, 2010

(65) Prior Publication Data

US 2010/0285969 A1 Nov. 11, 2010

Related U.S. Application Data

(62) Division of application No. 11/240,786, filed on Sep. 27, 2005, now Pat. No. 7,761,125.

(51) Int. Cl.
*H01L 39/24* (2006.01)
*H01P 1/00* (2006.01)

(52) U.S. Cl. ........ 505/210; 505/330; 505/701; 505/866; 333/99 S; 333/238

(58) Field of Classification Search .................. 505/202, 505/210, 230, 231, 700, 701, 866; 333/99, 333/99 S, 238
See application file for complete search history.

(56) References Cited

U.S. PATENT DOCUMENTS 7,761,125 B1 * 7/2010 Agassi et al. ................. 505/210

OTHER PUBLICATIONS

Remillard et al, "Three-Tone Intermodulation Distortion Generated by Superconducting Band Pass Filters," IEEE Transaction on Applied Superconductivity, vol. 13, No. 3 Sep. 2003, pp. 3797-3802.*

Oates et al ; "Nonlinear microwave surface impedance of YBCO films: latest results and present understanding", Physica C 372-376 (2002), pp. 462-468.*

* cited by examiner

*Primary Examiner* — Stanley Silverman
*Assistant Examiner* — Kallambella Vijayakumar
(74) *Attorney, Agent, or Firm* — Howard Kaiser

(57) ABSTRACT

Intermodulation distortion (IMD) is known to be an impediment to progress in superconductor-based filter technology. The present invention's methodology for reducing IMD can open doors to heretofore unseen practical applications involving high temperature superconductor (HTS) filters. Typical inventive practice includes (a) increasing the thickness d, and/or (b) changing the operation temperature T, of the filter's HTS film. The film's thickness d is increased in such a way as to decrease the IMD power $P_{IMD}$ in accordance with the material-independent proportionate relationship $$P_{IMD} \propto 1/d^{1.5\text{-}6}.$$

The film's operation temperature T is bettered or optimized in accordance with the material-independent proportionate relationship $$P_{IMD} \propto (\lambda_O(T))^{10}(K^{(2)}(T))^2/(\Delta_O(T))^6,$$

and further in accordance with three individual material-dependent relationships, namely, between operation temperature T and each of linear penetration depth $\lambda_O$, gap maximum $\Delta_O$, and kernel $K^{(2)}$. Some inventive embodiments include oxygen overdoping of the film as an additional/alternative IMD-reductive measure.

6 Claims, 7 Drawing Sheets

IMD-SELECTIVE DESIGN OF HTS-BASED FILTERS

CROSS-REFERENCE TO RELATED APPLICATIONS

This application is a divisional of U.S. nonprovisional patent application Ser. No. 11/240,786, filing date 27 Sep. 2005, now U.S. Pat. No. 7,761,125, issue date 20 Jul. 2010, hereby incorporated herein by reference, entitled "Intermodulation Distortion Reduction Methodology for High Temperature Superconductor Microwave Filters," joint inventors Yehoshua Dan Agassi and Daniel E. Oates.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to high temperature superconductors, more particularly to the use thereof in filters that may be suitable for electronic applications such as those involving communications or radar.

At the front end of practically every antenna (e.g., microwave or radio frequency receiver antenna) is a filter that eliminates (cuts off or excises) all frequencies outside of a predetermined frequency window (sometimes referred to as a "bandpass" or "bypass band"), thereby preventing the totality of the environmental signals from overwhelming the device. The operational principle of a typical filter is similar to that of a typical resonator cavity, which is designed to resonate at a predetermined frequency window (sometimes referred to as the resonator's "resonance frequency") where transmission is at its maximum, while at all other frequencies (i.e., frequencies outside of the resonance frequency) transmission is strongly suppressed.

A "flat" (frequency-independent) resonance frequency window is typically obtained from the combined effects of a series of inductively coupled narrow copper strips, which may be arranged in a variety of configurations. Each strip gives rise to a pole in the transfer function of the configuration; hence, the terms "strip" and "pole" have been used interchangeably in filter technology. The ensuing box-like bandpass is, roughly speaking, the sum of the slightly shifted hump-shaped (e.g., Gaussian-shaped, Chebyshev-shaped, Lorentzian-shaped, etc.) frequency windows that are each associated with a particular pole. A "linear" material is a material in which microwave transmission does not depend on the field intensity. For a filter made of a linear material, as the number of poles increases the bandpass approaches the ideal box-like shape. However, an increase in the number of strips, in combination with surface-impedance nonlinearity (the existence of which depends on the material) in each strip, represents the cause for the generation of intermodulation distortion (IMD) products. Surface-impedence nonlinearity is a property of high temperature superconductor (HTS) materials.

The term "intermodulation distortion" ("IMD") refers to the undesirable mixing of two signals whose mixing products lie within the bandpass. A case in point is the mixing of signals lying outside the nominal bandpass with signals lying within the bandpass, thus producing added frequency components that contribute to distortion of the desired signals.

IMD arises as a consequence of surface-impedence nonlinearity and perhaps other sources.

The IMD power level is a key performance measure of a filter. Copper-based filters are commonly used for antenna applications. In copper-based filters, where copper is highly linear, increasing the number of poles in order to approach a box-like frequency window constitutes a trade-off between an increase in the physical size on the one hand and losses of the device on the other hand. It would be desirable to provide a filter having all three attributes, viz., low IMD power level, low loss, and small physical size. The combination of these qualities in a filter could unleash new opportunities for various applications, both military and civilian, such as involving antennae arrays for radar applications and specialized (e.g., compact and sensitive) antennae aboard missiles and submarines. Generally speaking, HTS-based filters have two of these qualities, viz., extremely low losses and compactness, but are also characterized by surface-impedence nonlinearity and hence by tendency toward high IMD power levels.

The high temperature superconductor (HTS) family of materials has seen commercial success in the area of microwave filters for wireless communication. Over fifteen hundred HTS microwave filter units have been deployed in wireless communication base-stations; see R. W. Simon, R. B. Hammond, S. J. Berkowitz and B. A. Willemsen, *Proceedings of the IEEE* 92, 1585 (2004), incorporated herein by reference. In such applications, the copper poles are replaced with HTS poles. The commercial success of HTS microwave filters is mainly attributable to their practical and cost-effective cooling requirements (to T=77K, the liquid Nitrogen temperature), their relatively small size, and the much lower losses of HTS in comparison to those of copper (by two to three orders of magnitude at microwave frequencies). However, because of the surface-impedance nonlinearity that characterizes HTS, progress in this area is limited to low power applications. See the following publications, each of which is incorporated herein by reference: J. H. Claasen, J. C. Booth, J. A. Beall, L. R. Vale, D. A. Rudman and R. H. Ono, *Superconductor Science and Technology* 12, 714 (1999); J, C, Booth, L. R. Vale, R. H. Ono and J. H. Claasen, *Superconductor Science and Technology* 12, 711 (1999); H. Claasen, J. C. Booth, J. A. Beall, D. A. Rudman, L. R. Vale and R. H. Ono, *Applied Physics Letters* 74, 4023 (1999); J. C. Booth, J. A. Beall, D. A. Rudman, L. R. Vale and R. H. Ono, *Journal of Applied Physics* 86, 1020 (1999). IMD suppression is increasingly critical for operation in the increasingly crowded cellular phones communication spectrum. In addition, HTS nonlinearity must be reduced to realize emit-filter applications. HTS nonlinearity at microwave frequencies thus represents a bottleneck issue for future HTS filter applications.

SUMMARY OF THE INVENTION

In view of the foregoing, it is an object of the present invention to provide a methodology for reducing the amount of intermodulation distortion in a high temperature superconductor microwave filter.

Notwithstanding the advantageous nature of HTS filters in terms of their exceedingly low losses and their compactness, the intermodulation distortion in HTS filters is a major limiting factor in their usage for applications such as those involving emitantennae and high-degree frequency-discrimination antennae. The present invention serves to reduce the nonlinear surface impedance—and, hence, the intermodulation distortion (IMD)—of filters that are made of a high temperature superconductor (HTS) and that operate at microwave frequencies. Therefore, inventive practice can enhance the performance of HTS-based filters in receive-antenna applications, and can also extend the applicability of HTS-based filters to transmit-antenna applications, where typically a higher power level is required. Due to their strongly reduced IMD power level, the HTS filters that are designed or modified in accordance with the present invention are high performance HTS filters, practicable in a sharply defined linear frequency range in association with either receive antennae or emit antennae.

The present invention identifies three critical design parameters for reducing the power level of intermodulation distortion (IMD) in HTS filters, namely, (i) thickness of the HTS film, (ii) operation temperature of the HTS film, and (iii) oxygen overdoping of the HTS film. According to the inventive methodology, the edge integrity of the filter's poles/strips can be disregarded, especially when a pole/strip has a high aspect ratio (wherein aspect ratio is the ratio of strip width to strip thickness). Inventive practice of any one of the three above-noted parameters, or of any combination of two of these parameters, or of the combination of all three of these parameters, can attribute an HTS-based filter with a significant decrease in IMD. For typical inventive embodiments, the most influential parameter of the three is the HTS film thickness. The inventive increasing of the HTS film thickness, in and of itself, can yield significant lessening of IMD. The beneficial effects of a suitable increase in HTS film thickness can be enhanced through judicious selection(s) of the operation temperature and/or the degree of oxygen overdoping of the HTS films. The combined effect of all three independent design parameters has the potential for reducing the IMD power level by several orders of magnitude. The inventive principles allow for a large leeway for performance optimization of an HTS filter. The present invention can be practiced not only in association with HTS microwave filters but also in association with various other kinds of electronic apparatus that include superconductor film and a dielectric substrate upon which the superconductor film is disposed.

A filter is but one of the various kinds of electronic apparatus with respect to which the present invention's methodology can be practiced. In accordance with typical embodiments of the present invention, a method for improving performance of electronic apparatus comprises decreasing (e.g., significantly reducing) the power of intermodulation distortion characterizing the electric apparatus. The electronic apparatus includes superconductor film. The present invention's decreasing of the intermodulation distortion power includes either or both of the following: (a) increasing, by a selected factor, the thickness of the superconductor film; (b) changing the operation temperature of the superconductor film. The present invention's increasing of the thickness d of the superconductor film is performed in order that the factor by which the intermodulation distortion power $P_{IMD}$ is decreased equals the selected factor (by which said superconductor film thickness d is increased) raised to an exponent in the range between one-point-five and six. According to many inventive embodiments, the present invention's increasing of the thickness d of the superconductor film is performed in order that the factor by which the intermodulation distortion power $P_{IMD}$ is decreased equals the selected factor (by which said superconductor film thickness d is increased) raised to an exponent of four. Expressed another way, the present invention's proportionalilty relating IMD to thickness is $$P_{IMD} \propto 1/d^4.$$

Let us assume, for instance, that a first superconductor film has a first superconductor film thickness. The present invention's increasing of the superconductor film thickness includes applying at least one additional layer of superconductor film to the first superconductor film (where, for instance, each additional superconductor layer is associated with a relatively thin buffer layer that separates it from the preceding superconductor layer), thereby producing a second superconductor film that includes the first superconductor film and that has a second superconductor film thickness that is greater than the first superconductor film thickness.

The present invention's changing of the operation temperature of the superconductor film is typically performed in order to decrease a quotient to which the intermodulation distortion power is proportional. According to the quotient, the dividend is the product of the linear penetration depth $\lambda_O(T)$ raised to the exponent of ten and the kernel $K^{(2)}(T)$ (defined hereinbelow) raised to the exponent of two, and the divisor is the gap maximum ($\Delta_O$ (T) raised to the exponent of six. The present invention's changing of the operation temperature is often practiced as an optimizing adjustment of the operation temperature, setting an operation temperature that is "optimal" insofar as minimizing the quotient and hence minimizing the intermodulation distortion power. According to a typical inventive calculation of the optimal operation temperature T, the optimal operation temperature T is defined as the temperature for which the present invention's following mathematical combination of three temperature-dependent factors, i.e., $$(\lambda_O(T))^{10}(K^{(2)}(T))^2/(\Delta_O(T))^6,$$

is minimized. This temperature optimization has basis in one non-monotonic relationship (viz., the increase or decrease in the kernel as a function of temperature) and two monotonic relationships (viz., the increase in linear penetration depth as a function of temperature, and the decrease in gap maximum as a function of temperature). Each of the monotonic relationships is particular to the superconductor material, and varies depending on the superconductor material. The non-monotonic relationship depends to some extent on the superconductor material, as it contains certain material-dependent quantities. In contrast, the afore-described relationships involving the intermodulation distortion power—namely, the relationship of the intermodulation distortion power to the superconductor film thickness, and the relationship of the intermodulation distortion power to the quotient—are independent of the superconductor material, and in fact are independent of each other. According to some inventive embodiments, in addition to or in lieu of either or both of increasing the thickness of the superconductor film and changing the operation temperature, oxygen overdoping of the superconductor film is performed with the result of decreasing (e.g., significantly reducing) the intermodulation distortion power.

Other objects, advantages and features of the present invention will become apparent from the following detailed description of the present invention when considered in conjunction with the accompanying drawings.

BRIEF DESCRIPTION OF THE DRAWINGS

In order that the present invention may be clearly understood, it will now be described, by way of example, with reference to the accompanying drawings, wherein:

FIG. 1 is taken from page 116 of Zhi-Yuan Shen, *High-Temperature Superconducting Microwave Circuits*, Artech House, Boston (1994).

FIG. 2 is taken from D. E. Oates, S. H. Park, D. Agassi and G. Koren, "Temperature Dependence of Intermodulation Distortion in YBCO: Understanding Nonlinearity," *IEEE Transactions on Applied Superconductivity*, Vol. 15, No. 2, pp 3589-3595 (June 2005) (from the proceedings of the Applied Superconductivity Conference, Jacksonville, Fla., 3-8 Oct. 2004).

FIG. 3 illustrates a comparison of empirical data (represented by data points describing a curve) with theoretical calculation (represented by solid line curve) with respect to the temperature dependence of the nonlinear penetration depth as denoted by $\lambda_2$ (T). FIG. 3 is taken from the aforementioned D. E. Oates, S. H. Park, D. Agassi and G. Koren, "Temperature Dependence of Intermodulation Distortion in YBCO: Understanding Nonlinearity," *IEEE Transactions on Applied Superconductivity*, Vol. 15, No. 2, pp 3589-3595 (June 2005) (from the proceedings of the Applied Superconductivity Conference, Jacksonville, Fla., 3-8 Oct. 2004); and, D. Agassi and D. E. Oates, "Nonlinear Meissner Effect in a High-Temperature Superconductor," *Physical Review B* 72, 014538 (26 Jul. 2005).

FIG. 6 is taken from D. E. Oates, S. H. Park, M. A. Hein, J. P. Hirst and R. G. Humphreys, "Intermodulation Distortion and Third-Harmonic Generation in YBCO Films of Varying Oxygen Content," *IEEE Transactions on Applied Superconductivity* 13, 311 (June 2003).

DETAILED DESCRIPTION OF THE INVENTION

Figure 1:
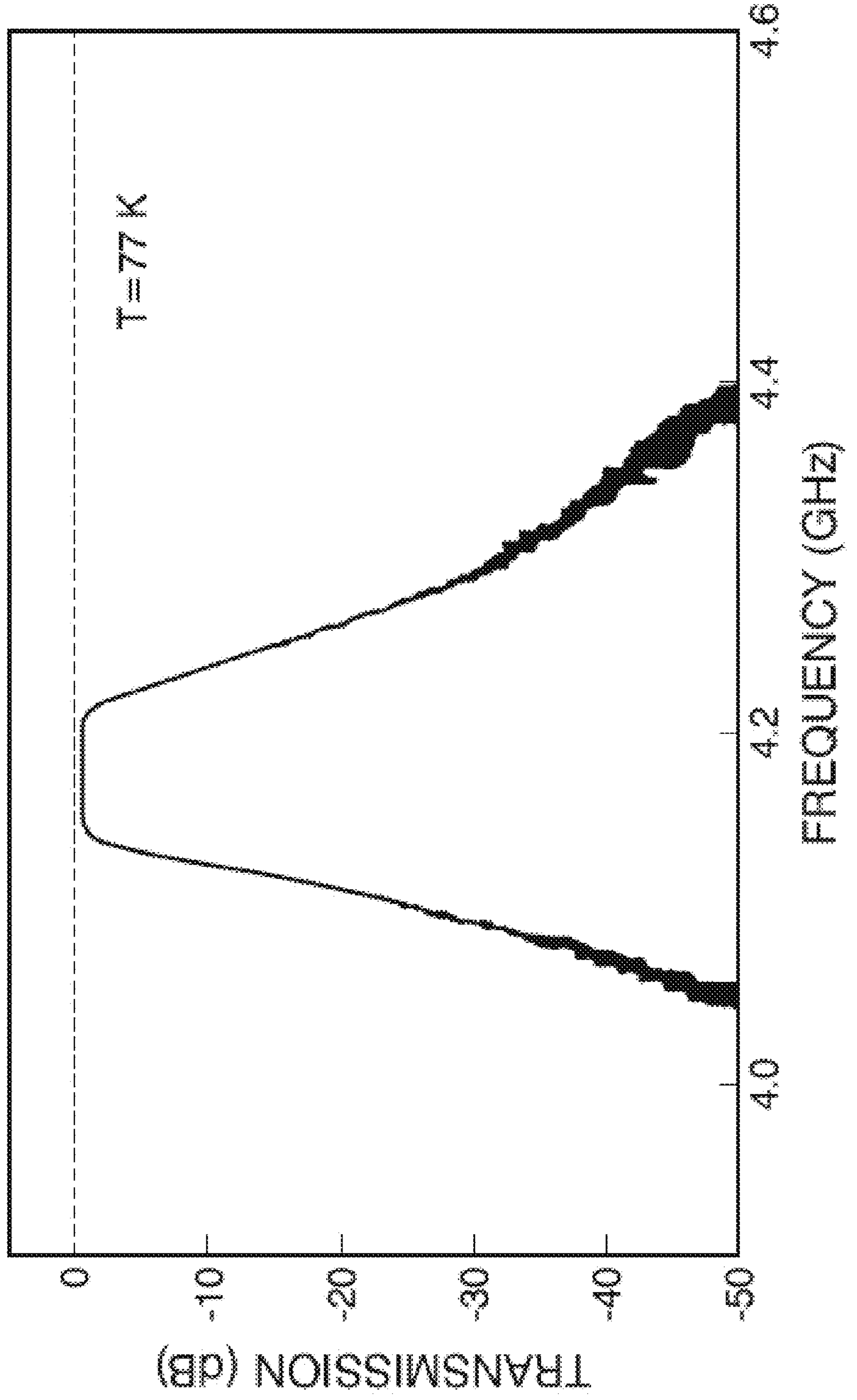
FIG. 1 is a graph of the measured transmission response, versus frequency, of a filter including film of postannealed YBCO superconductor material on $LaAlO_3$ substrate.

FIG. 1 typifies a box-like bandpass that results from the coupling of a collection of resonators, the number of which is equal to the number of poles of the transfer function. For a lossless linear material—one in which microwave transmission does not depend on the field intensity—increasing the number of poles increases the sharpness of the falloff outside of the bandpass. On the other hand, in a material with losses, an increase in the number of poles implies an increase in losses. A notable advantage of superconductors in this context is that they have a much lower loss than normal metals and thus can be implemented in compact geometries while maintaining sharp cutoffs. In addition to low losses, low nonlinearity is a very important characteristic of a material for realizing a high performance filter. IMD is a deleterious consequence of any surface-impedence nonlinearity.

Surface-impedance nonlinearity has been observed in thin films of low temperature superconductors (LTS), such as Niobium Nitrate (NbN), as well as in thin films of high temperature superconductors (HTS), such as YBCO ($Y_1Ba_2Cu_3O_{7-\delta}$), BSCCO ($Bi_2Sr_2CaCuO$ group), and TBCCO ($Tl_2Ba_2CaCuO$ group). See the following publications, each of which is incorporated herein by reference, regarding surface-impedance nonlinearity in thin films of LTS: P. P. Nguyen, D. E. Oates, G. Dresselhaus, M. S. Dresselhaus and A. C. Anderson, "Microwave Hysteretic Losses in $YBa_2Cu_3O_{7-X}$ and NbN Thin Films," *Physical Review B* 51, 6686 (March 1995); Y. M. Habib, C. J. Lehner, D. E. Oates, L. R. Vale, R. H. Ono, G. Dresselhaus and M. S. Dresselhaus, "Measurements and Modeling of the Microwave Impedance in High-$T_C$ Grain-Boundary Josephson Junctions: Fluxon generation and R F Josephson-Vortex Dynamics," *Physical Review B* 57, 13833 (June 1998). See the following publications, each of which is incorporated herein by reference, regarding surface-impedance nonlinearity in thin films of HTS: (2). J. H. Claasen, J. C. Booth, J. A. Beall, L. R. Vale, D. A. Rudman and R. H. Ono, *Superconductor Science and Technology* 12, 714 (1999); J, C, Booth, L. R. Vale, R. H. Ono and J. H. Claasen, *Superconductor Science and Technology* 12, 711 (1999); H. Claasen, J. C. Booth, J. A. Beall, D. A. Rudman, L. R. Vale and R. H. Ono, *Applied Physics Letters* 74, 4023 (1999); J. C. Booth, J. A. Beall, D. A. Rudman, L. R. Vale and R. H. Ono, *Journal of Applied Physics* 86, 1020 (1999).

A consensus regarding the origin of surface-impedance nonlinearity has emerged only recently. See the following publications, each of which is incorporated herein by reference: the aforementioned D. Agassi and D. E. Oates, "Nonlinear Meissner Effect in a High-Temperature Superconductor," *Physical Review B* 72, 014538 (26 Jul. 2005); D. Agassi and D. E. Oates, "Nonlinear Surface Reactance of a Superconductor Strip," *Journal of Superconductivity* 16, 905 (October 2003); the aforementioned D. E. Oates, S. H. Park, D. Agassi and G. Koren, "Temperature Dependence of Intermodulation Distortion in YBCO: Understanding Nonlinearity," *IEEE Transactions on Applied Superconductivity*, Vol. 15, No. 2, pp 3589-3595 (June 2005) (from the proceedings of the Applied Superconductivity Conference, Jacksonville, Fla., 3-8 Oct. 2004); D. E. Oates, M. H. Hein, P. J. Hirst, R. G. Humphreys, G. Koren and E. Polturak, "Nonlinear Microwave Surface Impedance of YBCO Films: Latest Results and Present Understanding," *Physica C* 372-376, 462 (August 2002; available online 9 Apr. 2002); T. Dahm and D. J. Scalapino, *Applied Physics Letters* 81, 2002 (1997); T. Dahm and D. J. Scalapino and B. A. Willemsen, *Journal of Superconductivity* 12, 339 (1999); D. E. Oates, S.-H. Park, D. Agassi and G. Koren, "Temperature Dependence of Intermodulation Distortion in YBCO," *Superconductor Science and Technology* 17, S290-S294 (May 2004); D. E. Oates, S.-H. Park and G. Koren, "Observation of the Nonlinear Meissner Effect in YBCO Thin Films: Evidence for a d-Wave Order Parameter in the Bulk of the Cuprate Superconductors," *Physical Review Letters* 93, 197001 (November 2004).

Figure 2:
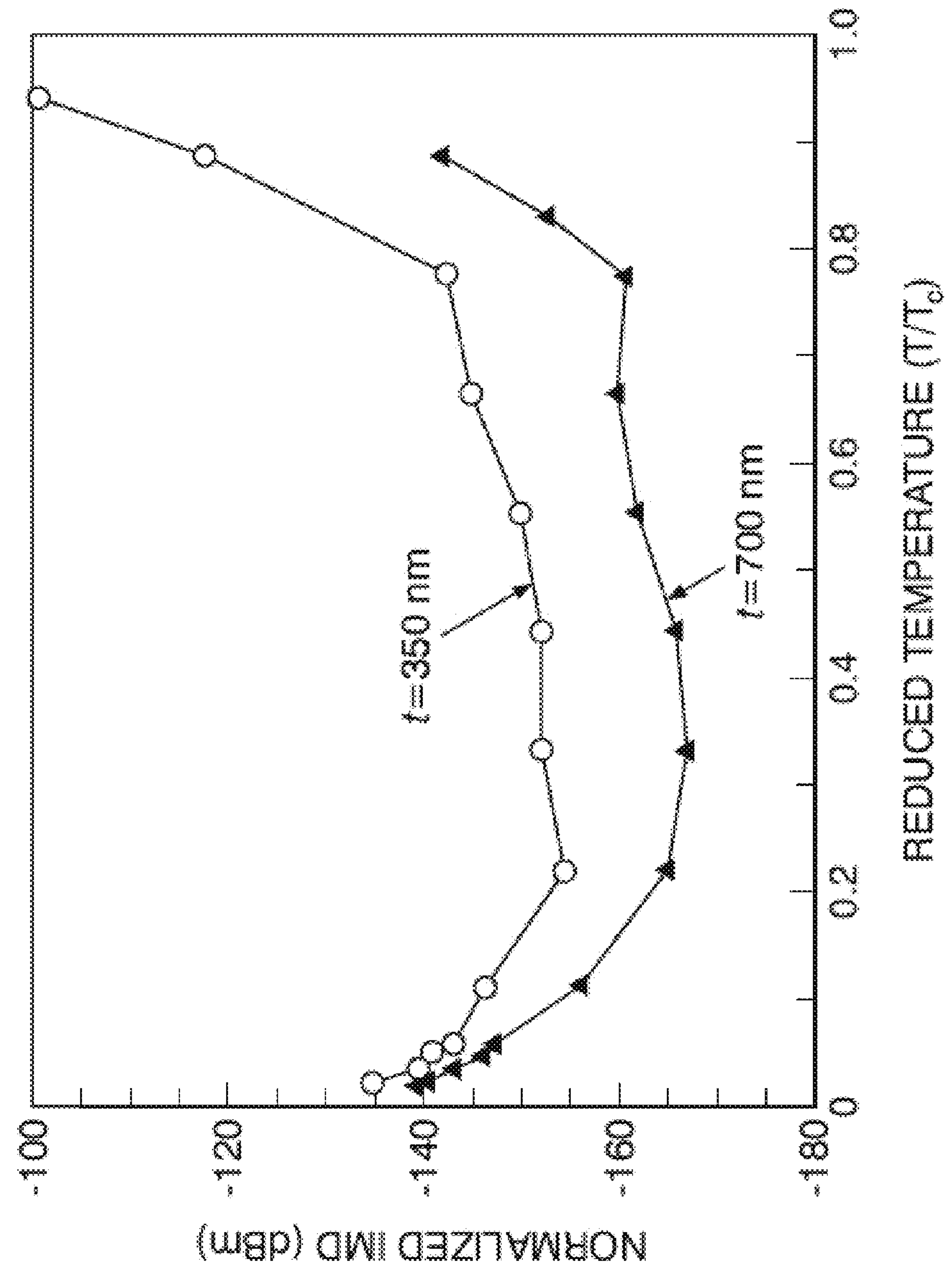
FIG. 2 is a graph of the normalized IMD power (in dBm units), as a function of the reduced temperature, for HTS film of two different film thicknesses "t" (viz., 350 nm and 700 nm).
Figure 3:
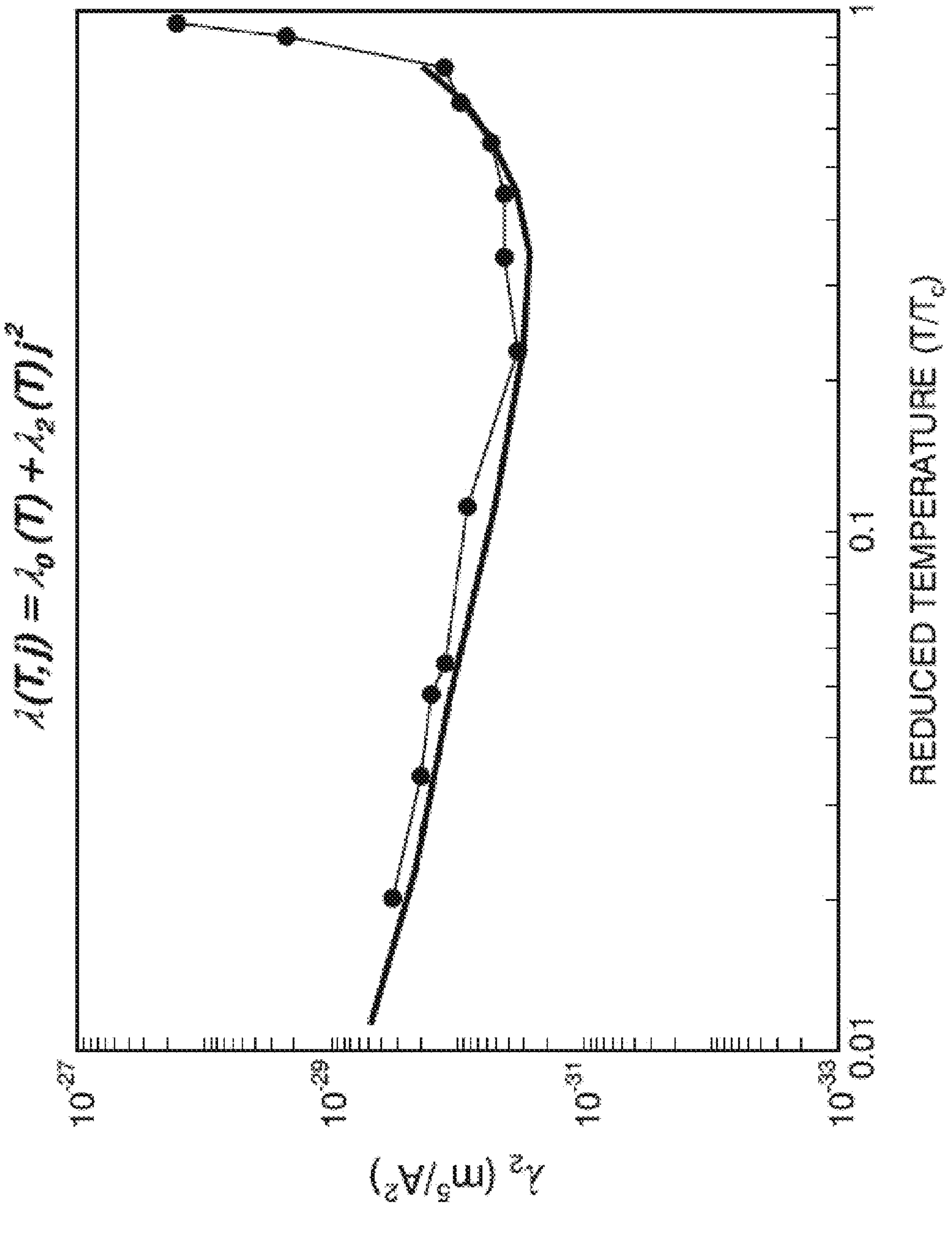
FIG. 3 is a graph of the nonlinear penetration depth $\lambda_2$ as a function of the reduced temperature.

Superconductivity is a manifestation of a highly correlated condensate state of matter. Recent data in high quality YBCO films provides clear evidence that the observed nonlinearity is intrinsic to the highly correlated condensate state that underlies superconductivity. This intrinsic nonlinearity proposition is consistent with recent developments in the field. Firstly, empirical observations have been made as to thickness dependencies of IMD, such as illustrated in FIG. 2. Secondly, empirical observations have been made as to the distinct low-temperature dependencies of the nonlinearities in LTS and HTS, such as illustrated in FIG. 3. Thirdly, as further illustrated in FIG. 3, theoretical calculations have been made that fit the observed data demonstrating low-temperature dependence of the nonlinearities in LTS and HTS. The present invention uniquely avails itself of these findings in providing a novel methodology involving up to three parameters that determine the IMD power level, viz., (i) thickness of the strip (film), (ii) operating temperature (in the context of the filter) for the strip, and (iii) the extent of oxygen overdoping of the strip.

The present invention's methodology is premised on an intrinsic or extrinsic mechanism for the observed intermodulation distortion—i.e., on the notion that the observed intermodulation distortion is of intrinsic or extrinsic origin to the superconductor state of matter. The inventive analysis is a novel theoretical construct that features Expressions (1) through (3), set forth hereinbelow. Suggested by the inventive analysis is the dependence of the intermodulation distortion power level on the film thickness and the operation temperature. More specifically, the inventive analysis suggests that the IMD power level decreases rapidly with the film thickness in accordance with $d^{-4}$, wherein d denotes the film thickness. The inventive analysis also suggests an approach to determining the optimal operation temperature, wherein T denotes the operation temperature.

Figure 4:
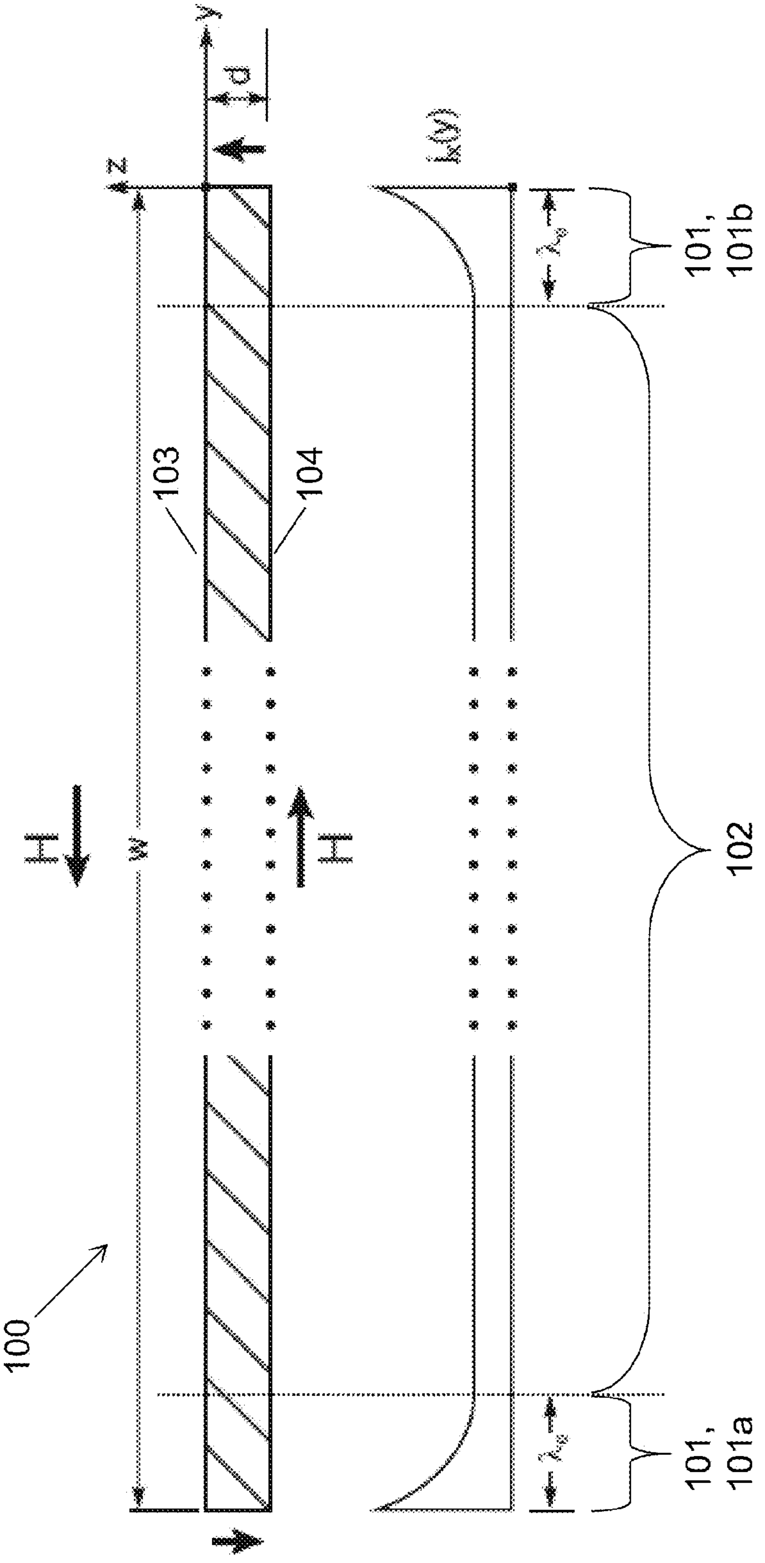
FIG. 4 is a graph together with a schematic cross-sectional transverse elevation view of a single HTS strip having a width w and a thickness d. The HTS strip is characterized by an aspect ratio, defined as w/d, that is high. Considered in conjunction with the schematic view of the HTS strip, the graph illustrates variation in the current density profile $j_x(y)$ in accordance with the width w of the HTS strip.

Reference is now made to FIG. 4, which correlates the profile of microwave current-density $j_x(y)$ with the widthwise cross-section (sectioned at a location away from the longitudinal ends of HTS strip 100) of a wide and long HTS strip 100 having a high aspect ratio (width w>>thickness d), such proportions being typical of conventional filter poles. The microwave current-density profile is strongly peaked at the edges (i.e., in the two lateral domains 101*a* and 101*b*), but is much lower and is constant in the middle (i.e., in the medial domain 102). See U.S. nonprovisional application Ser. No. 10/609,866, filed 1 Jul. 2003, entitled "Strips for Imparting Low Nonlinearity to High Temperature Superconductor Microwave Filters," sole inventor Yehoshua Dan Agassi, incorporated herein by reference. The microwave current-density profile extends into the film 100 over the London (i.e., linear) penetration-depth length, denoted by $\lambda_0$, while the associated magnetic field wraps around the strip 100 cross-section. For a typical HTS strip 100, the penetration-depth length $\lambda_0$ is two to three orders of magnitude smaller than the width w.

Figure 5:
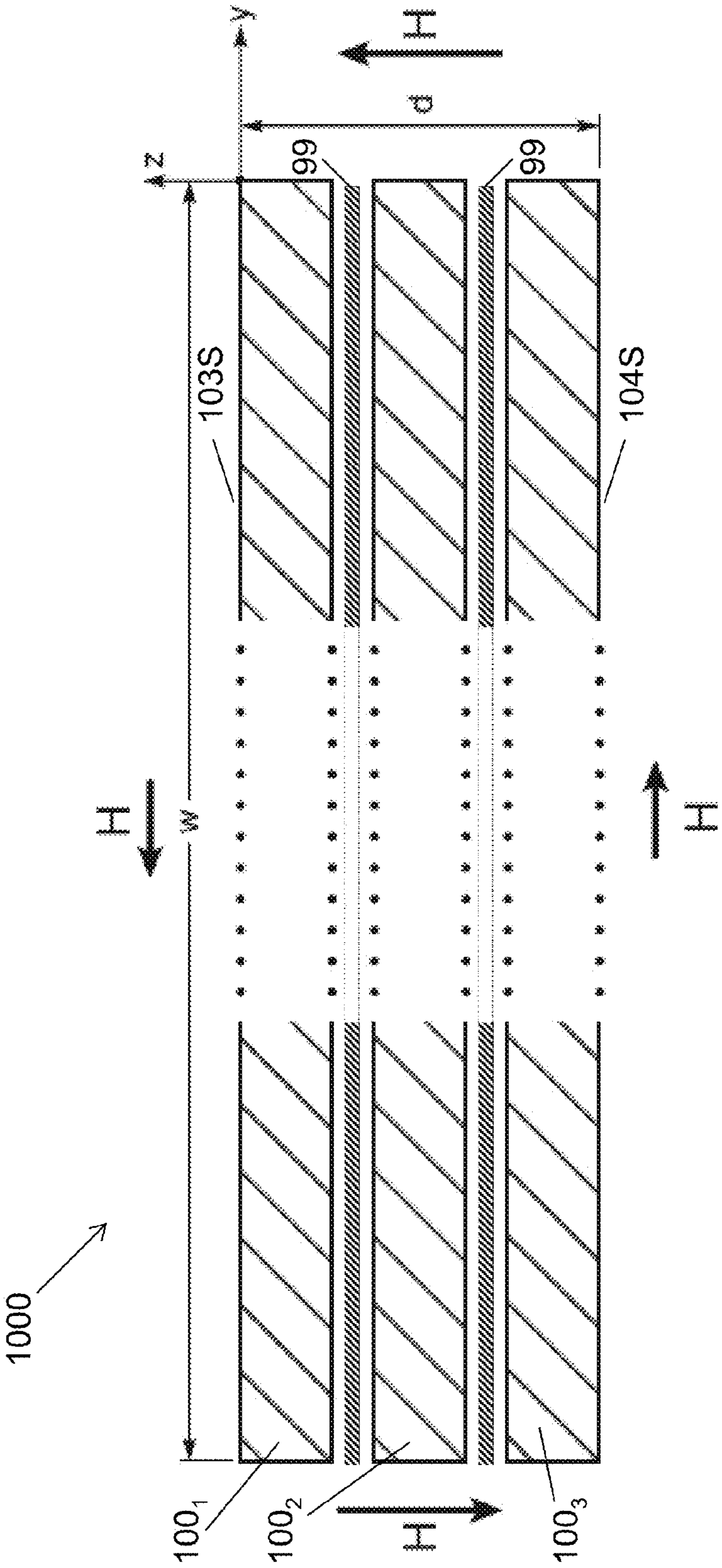
FIG. 5 is a schematic view, similar to the view of a single HTS strip in FIG. 4, of a stack of three HTS strips. The HTS strips describe a stacked configuration wherein adjacent surfaces are contiguous to or in close contact with each other. The stack of HTS strips is characterized by a width w and a thickness d, which represents the overall thickness (also referred to herein as the "effective thickness") of the combined HTS strips in the stack.

While the current distribution shown in FIG. 4 suggests the importance of the strip edges in carrying electrical current, the present invention's methodology considers the total electrical current I that is carried by an HTS film (e.g., an HTS strip 100 or an HTS stack 1000 of strips 100) to be a determinative factor of its nonlinearity. A careful many-body theoretical analysis conducted by the present inventors demonstrates that, for high aspect ratio strips 100, most of the current is carried in the broad medial domain 120 of strip 100, notwithstanding the existence of the current density peaks in the two lateral domains 101*a* and 101*b* such as illustrated in FIG. 4. The present invention's strategy is predicated in part on the notion of the importance, as pertains to IMD, of the total current I that is conducted by a strip 100 (such as depicted in FIG. 4) or a stack 1000 (such as depicted in FIG. 5). The significance of total current I is manifest in the present invention's novel mathematical relationships of proportionality and equality, which are set forth hereinbelow as Expressions (1), (2) and (3).

The present invention's theoretical analysis identifies material-based, external and/or geometric parameters that determine the nonlinearity and hence the IMD. Specifically addressing the low-power regime pertinent to receive-antenna applications, for a d-wave superconductor such as HTS the inventive analysis yields the following proportionality for the nonlinear penetration depth length $\lambda_{NL}$:

$$\lambda_{NL} \propto \frac{(\lambda_0(T))^5 I^2}{(\Delta_0(T))^3 d^2} K^{(2)}(T) \tag{1}$$

where the kernel $K^{(2)}(T)$ is defined by the equation $$K^{(2)}(T) = \frac{q_S^4 \alpha \mu^2 k_F(\hat{c})}{\pi^3 \beta m_{ab} c^2 (\hbar c)^2} \sum_{n=-\infty}^{\infty} \int_0^{2\pi} d\theta (\cos^4\theta)(\cos^2 2\theta) \frac{(\cos^2 2\theta - (2\hbar\omega_n / \Delta_0(T))^2)}{(\cos^2 2\theta + (\hbar\omega_n / \Delta_0(T))^2)^{7/2}} \tag{2}$$

As the inventive analysis continues, the intermodulation power $P_{IMD}$ is related to Expression (1) in the following proportionalities:

$$P_{IMD} \propto (I\lambda_{NL}(I, T))^2 \propto \frac{(\lambda_0(T))^{10} I^6}{(\Delta_0(T))^6 d^4} (K^{(2)}(T))^2 \tag{3}$$

The relevant symbols in Expressions (1), (2) and (3) are the following, where all quantities are in the centimeter-gram-second (CGS) system of metric units: d is the thickness of the HTS film; T is the temperature of operation of the HTS strip (which includes the HTS film); I is the total current being conducted by the HTS film; $\lambda_{NL}$ is the nonlinear penetration depth; $\lambda_{NL}$ (I,T) is the nonlinear penetration depth at total current I and operation temperature T; $\lambda_O$ (T) is the linear ("London") penetration depth length at operation temperature T; $\Delta_O$ (T) is the maximum of the gap at operation temperature T; $q_S$ is the charge of a single carrier, i.e., an electron or hole; $\alpha \approx 2$ is a dimensionless geometrical factor (See the aforementioned D. Agassi and D. E. Oates, "Nonlinear Meissner Effect in a High-Temperature Superconductor," *Physical Review B* 72, 014538 (26 Jul. 2005)); $\mu$ is the Fermi energy; $k_F$ ($\hat{c}$) is the Fermi momentum in the $\hat{c}$ crystal-axis direction; $\beta = 1/(k_B T)$, where $k_B$ is the Boltzman constant; $m_{ab}$ is the effective mass in the ab crystal plane; c is the speed of light; $\hbar = h/(2\pi)$, where h is Planck's constant; $\omega_n = ((2n+1)\pi)/(\beta\hbar)$, where n is any integer, positive or negative (These quantities have been called "Matsubara frequencies"); $P_{IMD}$ is the power level of the intermodulation distortion (IMD) of the HTS filter. Of particular import is the relationship of proportionality between the lefthand and righthand sides of Expression (3), viz., $$P_{IMD} \propto (\lambda_O(T))^{10} I^6 (K^{(2)}(T))^2 / (\Delta_O(T))^6 d^4.$$

In Expressions (1), (2) and (3), film thickness d, operation temperature T, and total current I are external or geometric parameters. $\lambda_O$ (T), the linear penetration depth length at operation temperature T, is a material-dependent parameter. $\Delta_O$ (T), the gap's maximum at operation temperature T, is also a material-dependent parameter. The kernel $K^{(2)}(T)$ contains three material-dependent parameters, viz.: Fermi energy, $\mu$;

Fermi momentum $k_F(\hat{c})$, in the $\hat{c}$ crystal-axis direction; effective mass $m_{ab}$, in the ab crystal plane. Expression (3) exhibits the intricate interplay of the individual external/geometry parameters I, d, T, together with the individual material-dependent parameters, $\lambda_O$ (T) and $\Delta_O$ (T), in determining the IMD power level $P_{IMD}$. The parameters $\lambda_O$ (T) and $\Delta_O$ (T) are determined by the material of choice, which in inventive practice can be any high temperature superconductor material. The material of choice is YBCO in accordance with many embodiments of the present invention. The total current I is application-dependent.

Therefore, once the inventive practitioner has selected the material (usually, YBCO) for the HTS film in the context of a given HTS filter, the remaining control parameters to optimize the IMD power level (e.g, minimize IMD power, or maximum reduction in IMD power) are the superconductor film thickness d and the operation temperature T (of the superconductor film), which are related to IMD power level $P_{IMD}$ as set forth hereinabove in the present invention's Expression (3). The film thickness d and the operation temperature T are the two entirely "independent" IMD power reduction "control" factors in Expression (3). A practical significance of this complete independence of film thickness d and operation temperature T is that the inventive methodology can be applied—to any existing or conceptual HTS filter for which a certain HTS material composition of the film is established or assumed—so as to modify or specify these two IMD power-affecting independent parameters in accordance with the present invention's Expression (3). As elaborated upon hereinbelow, a third IMD power-affecting independent parameter consists in oxygen overdoping of the HTS film.

Figure 7:
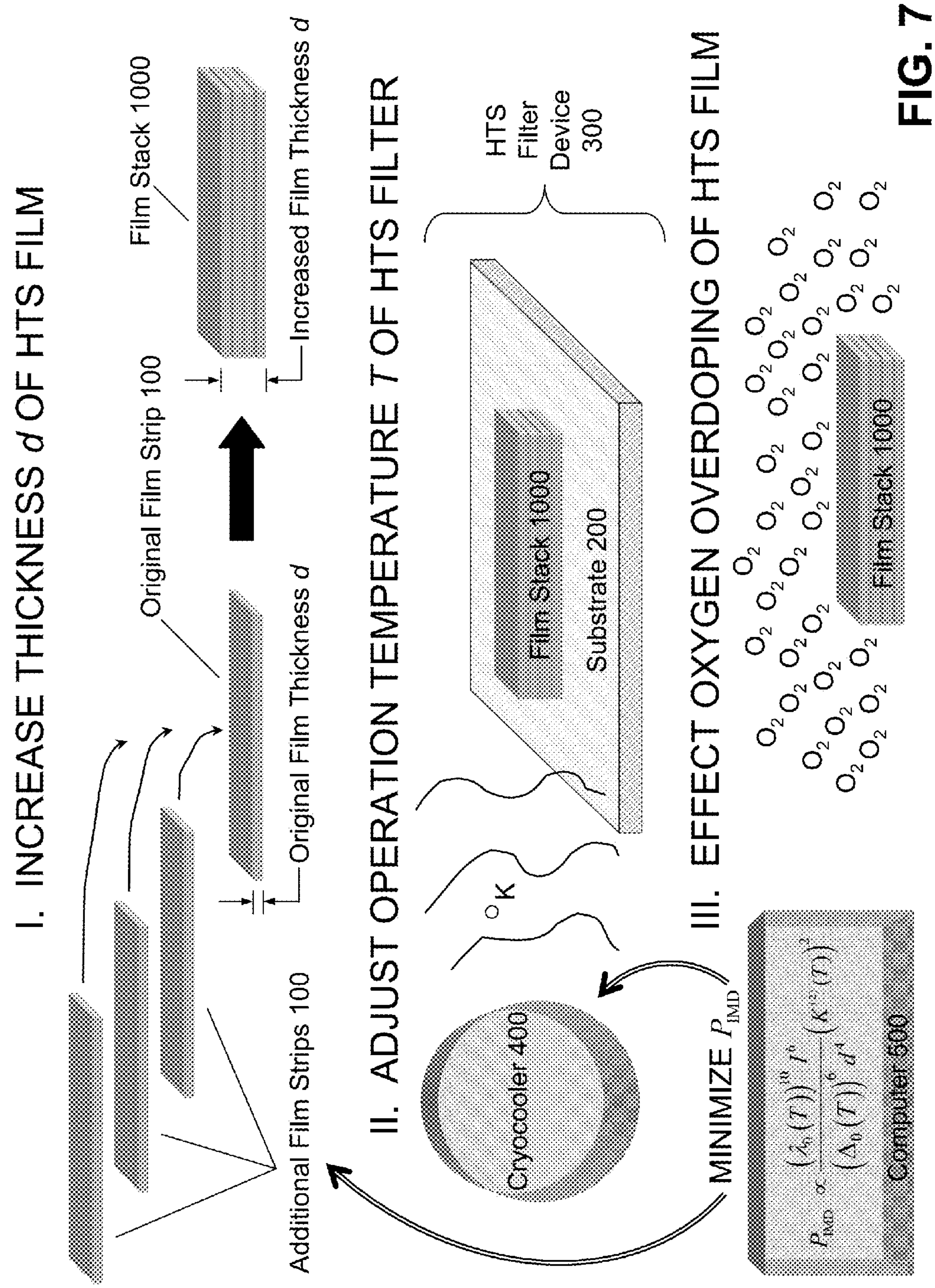
FIG. 7 is a schematic of an embodiment of a method, in accordance with the present invention, for reducing intermodulation distortion of an HTS microwave filter.

The first independent IMD power reduction control factor in Expression (3) is the increase in thickness d of the HTS film. As conveyed by Expression (3), the IMD power $P_{IMD}$ scales with film thickness d in accordance with $d^{-4}$ exponential law. The present invention's theoretical proposition that IMD power $P_{IMD}$ changes (e.g., is reduced) with film thickness d in accordance with a $d^{-4}$ scaling has been verified experimentally by the present inventors. The present invention's $d^{-4}$ scaling provides impetus for effecting a film configuration of tightly stacked strips (either with or without one or more buffer layers 99) such as depicted in FIG. 5 and FIG. 7, wherein the stack 1000 (of strips 100) acts as one thick film strip characterized by a film thickness d. In accordance with typical embodiments of the present invention in which an increase is effected in film thickness d, the increase in film thickness d is uniformly effected over the entire expanse of the superconductor film. The inventively amplified version of the superconductor film thus describes the same kind of three dimensional shape as does the original version of the superconductor film, only thicker; that is, both the original film version and the amplified film version describe the same shape in two dimensions (i.e., the same planar perimeter), but the amplified film version is greater than the original film version in the third (i.e., thickness-wise) dimension. For instance, according to conventional practice superconductor film is frequently implemented in the form of a "strip" that describes a rectangular parallelepiped (or rectangular prism) shape. An inventively thickened version of the strip will describe the same rectangular shape described by each of the two opposite plan-form film surfaces, but will be thicker between these two surfaces. In other words, the inventively thickened film will have the same rectangular perimeter but will not be as flat (thin) as the original film. In addition, the plural superconductor film layers of the inventively amplified superconductor film are adjacently and closely arranged so that every pair of adjacent layers is contiguous to or in contact with each other.

Tripling the film thickness d (i.e., increasing the film thickness d by a factor of three), for instance, an objective within reach of current film-growth techniques, is therefore predicted by Expression (3) to result in a reduction in IMD power $P_{IMD}$ by a factor of eighty-one, independent of the operation temperature T; otherwise expressed, the reduced intermodulation distortion power is $1/81$ of the non-reduced intermodulation distortion power. YBCO-based filter films are typically grown at an arbitrary film thickness around d=350 nm. Tripling of a typical YBCO-based film would therefore result approximately in a film thickness d=1,050 nm. As other examples, doubling the film thickness d (i.e., increasing the film thickness d by a factor of two) results in a reduction in the IMD power $P_{IMD}$ by a factor of sixteen; otherwise expressed, the reduced intermodulation distortion power is $1/16$ of the non-reduced intermodulation distortion power. Quadrupling the film thickness d (i.e., increasing the film thickness d by a factor of four) results in a reduction in the IMD power $P_{IMD}$ by a factor of two hundred fifty-six; otherwise expressed, the reduced intermodulation distortion power is $1/256$ of the non-reduced intermodulation distortion power. Increasing the film thickness d by fifty percent (i.e., increasing the film thickness d by a factor of 1.5) results in a reduction in the IMD power $P_{IMD}$ by a factor of approximately five; otherwise expressed, the reduced intermodulation distortion power is about $1/5$ of the non-reduced intermodulation distortion power.

Expression (3) thus predicts a certain amount of decrease in the IMD power $P_{IMD}$ in accordance with a certain amount of increase in film thickness d. Expression (3) also predicts, conversely, a certain amount of increase in the IMD power $P_{IMD}$ in accordance with a certain amount of decrease in film thickness d. For instance, halving the film thickness d (i.e., "increasing" the film thickness d by a factor of 0.5, or in other words decreasing the film thickness d by a factor of two) results in an increase in the IMD power $P_{IMD}$ by a factor of sixteen. Expression (3) can thus be used to predict any amount of change in the IMD power $P_{IMD}$ in accordance with any amount of change in film thickness d. Any change in the film thickness d results in a change in the IMD power $P_{IMD}$ that is independent of the operation temperature T. Therefore, according to frequent inventive practice, the inventive practitioner increases by a selected factor the thickness of the superconductor film, thereby decreasing by a selected factor the intermodulation distortion power that characterizes the electric apparatus. The factor by which the intermodulation distortion power is decreased equals the factor by which the superconductor film thickness is increased raised to an exponent of four. Mathematically speaking, the "factor" by which the intermodulation distortion power is decreased is the quantity by which the intermodulation distortion power is divided so as to yield the decreased intermodulation distortion power; the "factor" by which the superconductor film thickness is increased is the quantity by which the superconductor film thickness is multiplied so as to yield the increased superconductor film thickness.

The present invention's material-independent proportionate relationship $$P_{IMD} \propto 1/d^4,$$

defined by Expression (3), is believed by the present inventors to be accurate for many but not all applications. The exponent to which superconductor film thickness d is raised in the proportionate relationship with IMD power $P_{IMD}$ may vary in accordance with any one or combination of factors such as the amount of power involved in the application (e.g., higher power applications versus lower power applications), the amount of impurities in the superconductor film, the amount of oxygen overdoping applied to the superconductor film, etc. In order to cover the vast majority of applications involving utililization of superconductor film, the present invention provides for a range of 1.5 to 6 for the exponent to which film thickness d is raised in the proportionate relationship with IMD power $P_{IMD}$. In other words, the factor by which the intermodulation distortion power $P_{IMD}$ is decreased equals the factor by which the superconductor film thickness d is increased raised to an exponent in the range between one-and-one-half (1.5) and six (6). Otherwise expressed, $$P_{IMD} \propto 1/d^x,$$

where $1.5 \leqq x \leqq 6$.

The symbol "d," as used herein, represents the overall thickness of the HTS strip (if there is only one strip 100, such as depicted in FIG. 4) or strips (if there is a stack 1000 of two or more strips 100, such strips $\mathbf{100}_1$, $\mathbf{100}_2$ and $\mathbf{100}_3$ depicted in FIG. 5). A stack 1000 of strips 100 can be embodied either in the presence of at least one buffer layer 99 or in the absence of any buffer layer 99. Generally, if one or more buffer layers 99 are present, each pair of adjacent strips 100 has a buffer layer 99 situated therebetween. In the case of a single strip 100, thickness d represents the actual thickness of that strip 100, measured from the top surface 103 to the bottom surface 104 of that strip 100, such as shown in FIG. 4. In the case of a stack 1000 of plural strips 100, thickness d represents the "effective thickness" of all of the plural strips in the stack, measured between the extreme end surfaces in the stack, for instance, measured from the top strip $\mathbf{100}_1$'s top surface 103*s* to the bottom strip $\mathbf{100}_3$'s bottom surface 104*s*, such as shown in FIG. 5. This definition of thickness d of a stack 1000 is the same regardless of whether all of the strips 100 are stacked next to one another (i.e., without any buffer layer 99), or whether one or more pairs of adjacent strips 100 are separated by a buffer layer 99. Stack 1000 (which includes tightly stacked strips $\mathbf{100}_1$, $\mathbf{100}_2$ and $\mathbf{100}_3$) is considered by the present invention to describe a single overall strip characterized by an overall thickness d that extends from one extreme strip surface to the opposite extreme strip surface.

The single strip depicted in FIG. 4 and the tightly stacked strips depicted in FIG. 5 represent two alternative configurational modes, either of which lends itself to effectuation of IMD reduction via thickness scaling in accordance with the present invention. For purposes of inventive practice, the stack 1000 of strips shown in FIG. 5 acts, in effect, as one thick strip. The magnetic field in the multi-strip configuration of FIG. 5 will tend not to leak in between the stacked strips, due to the unfavorableness of the energy expense that will be associated with the required bending of the magnetic field lines. Regardless of whether the subject HTS film is constituted as a single strip 100 (such as shown in FIG. 4) or a stack 1000 of plural strips 100 (such as shown in FIG. 5), the present invention can be practiced efficaciously; in particular, as long as the aspect ratio w/d of the HTS film is >>1, the substantial IMD reduction associated with increased film thickness, implied by the present invention's Expression (3), is viable.

The second independent IMD power reduction control factor in Expression (3) is the choice of an optimal operation temperature T for the HTS filter of interest. T represents the operation temperature of the superconductor film itself, which typically will be very close to (but not necessarily equal to) the "operation temperature" of the electronic apparatus that includes the superconductor film. The three temperature-dependent factors in Expression (3), namely, $\{K^{(2)}(T), \lambda_0(T), \Delta_0(T)\}$, have qualitatively different temperature dependencies. In Expression (3), the following temperature relationships obtain. Factor $K^{(2)}(T)$ is non-monotonic, whereas the factors $\lambda_0(T)$ and $\Delta_0(T)$ are monotonic. With decreasing temperature T, the factor $K^{(2)}(T)$ first decreases, followed by a sharp upturn at low temperatures T. The factor $\lambda_0(T)$ decreases with decreasing temperature T. The factor $\Delta_0(T)$ increases with decreasing temperature T. It follows that there is an optimal temperature T for which the mathematical combination of all three temperature-dependent factors in Expression (3), viz., $$(\lambda_O(T))^{10}(K^{(2)}(T))^2/(\Delta_O(T))^6,$$

is at a minimum. In the case of YBCO, this optimal operation temperature T is in the approximate range T=30-50K, a temperature range that is comfortably within the reach of commercially available cryocoolers. The present invention's judicious selection of the operation temperature T, easily calculated from the present invention's Expression (3), in and of itself represents a significant reductive dynamic with respect to the IMD power $P_{IMD}$.

Figure 6:
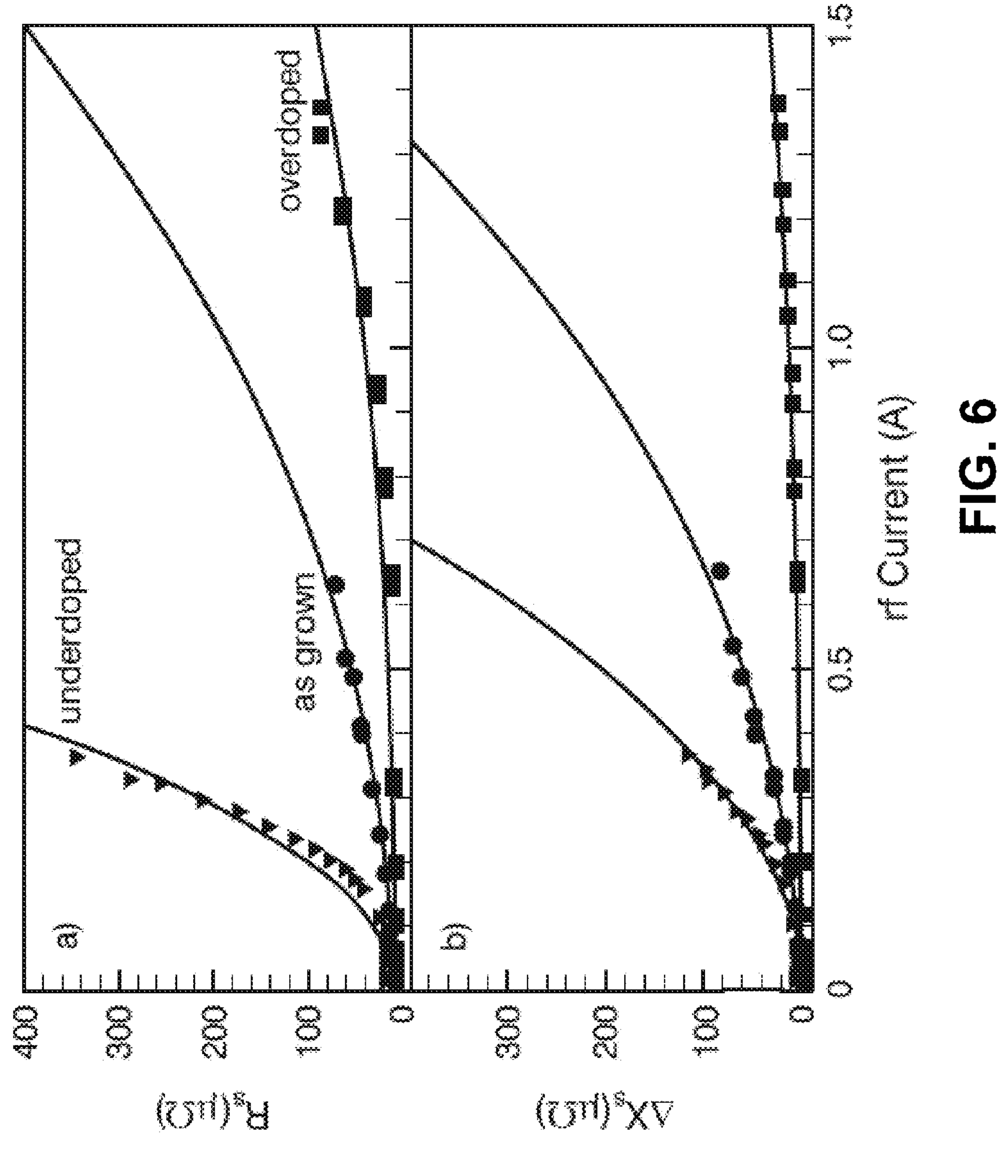
FIG. 6 is a doubly representative graph, illustrating (a) oxygen overdoping suppression of the surface resistance $R_S$ and (b) oxygen overdoping suppression of the reactance $\Delta X_S$, for YBCO films as a function of the RF current.

The third independent IMD power reduction control factor in accordance with the present invention is oxygen overdoping of the HTS film. The inventors have observed that, in YBCO films, oxygen overdoping has the effect of reducing IMD power level. FIG. 6 illustrates the significant effect of oxygen overdoping for YBCO films. See the aforementioned D. E. Oates, S. H. Park, M. A. Hein, J. P. Hirst and R. G. Humphreys, "Intermodulation Distortion and Third-Harmonic Generation in YBCO Films of Varying Oxygen Content," *IEEE Transactions on Applied Superconductivity* 13, 311 (June 2003). While such overdoping is known to reduce the critical temperature, the critical temperature $T_C$ is still very high ($T_C$=80-90K) in comparison to the optimal operation temperature prescribed by the present invention. The independent IMD reduction factors in Expression (3) can thus be combined with the effect of HTS oxygen overdoping.

To recapitulate, where the total current level I, the linear penetration depth $\lambda_O(T)$, and the gap $\Delta_O(T)$ are each a given for the material of choice (e.g., YBCO), there are three control parameters that can be optimized toward a maximum IMD power level reduction. The two control parameters pursuant to Expression (3) are the operation temperature T and the film thickness d; the third control parameter is oxygen overdoping. With reference to FIG. 7, the operation temperature T of an HTS filter device 400 (which includes a dielectric substrate 200 and, situated thereon, HTS film such as a strip 100 or a stack 1000) can be optimized by setting the temperature T of the cooling source (e.g., cryocooler 400) in accordance with a temperature T optimization calculation pursuant to Expression (3). Additionally manifest in Expression (3) is the favorable consequence, in terms of reducing IMD power level, of thickening (increasing the thickness of) the HTS film. As illustrated in FIG. 7, the present invention's three main IMD power reduction steps—viz, increasing the film thickness (e.g., the thickness of a strip or the "effective" thickness of a stack of strips), choosing an optimal operating temperature, and oxygen overdoping the film—are independent of each other and can be brought to bear singly or in any combination. Collectively, these three independent IMD power reduction factors give wide latitude for designing high IMD-suppression HTS filters. The actual amount of IMD power reduction in a particular case depends on the particular choice of parameters. Inventive practice has the potential of reaching three or more orders of magnitude reduction of IMD power reduction in an HTS filter of interest.

Of particular note are recently developed HTS film growth techniques for growing multilayer configurations of HTS film. See, e.g., S. R. Foltyn, P. N. Arendt, Q. X. Jia, H. Wang, J. L. MacManus-Driscoll, S. Kreiskott, R. F. DePaula, L. Stan, J. R. Groves, and P. C. Dowden, "Strongly Coupled Critical Current Density Values Achieved in $Y_1Ba_2Cu_3O_{7-\delta}$ Coated Conductors with Near-Single-Crystal Texture," *Applied Physics Letters*, Vol. 82, No. 25, pages 4519-4521 (23 Jun. 2003), incorporated herein by reference; Q. X. Jia, S. R. Foltyn, P. N. Arendt, and J. R. Smith, "High-Temperature Superconducting Thick Films with Enhanced Supercurrent Carrying Capability," *Applied Physics Letters*, Vol. 80, No. 9, pages 1601-1603 (4 Mar. 2002), incorporated herein by reference. Foltyn et al., *Applied Physics Letters* and Jia et al., *Applied Physics Letters* teach a method of making a multilayer configuration that includes superconductor layers and relatively thin buffer layers that separate the superconductor layers. See also the following United States patent documents, each of which is hereby incorporated herein by reference: Jia et al. U.S. Pat. No. 6,383,989 B2 issued 7 May 2002; Jia et al. U.S. Patent Application Publication No. US 2001/0056041 A1 published 27 Dec. 2001.

FIG. 7 illustrates the present invention's maxim, "the thicker, the better," which is suggested by Expression (3). In other words, the greater the thickness of the HTS film, the lesser the IMD power (and hence the greater the performance) of the HTS filter that includes the HTS film. As previously pointed out herein, the typical thickness d of a traditionally grown YBCO film is approximately 350 nm. Recently developed HTS film growth methods, such as disclosed by Foltyn et al. in their abovementioned *Applied Physics Letters* publication and Jia et al. in their abovementioned *Applied Physics Letters* publication, can be inventively implemented for making a multilayer stack 1000 having any plural number of layers (within practical limits) and having markedly increased thickness d as compared with the conventional thickness d≈350 nm. A stack 1000 describing a multilayer HTS material system (e.g., a two-layer system, a three-layer system, a four-layer system, etc.) can be fabricated either "from scratch" or by way of amplifying a previously existing HTS film such as in the form of a single strip 100. Incidentally, present joint inventor Agassi has observed that a multilayer superconductor film configuration may be advantageous in another respect, namely, in facilitating the pinning of vortices in high power applications, due to the discrete nature of the individual film layers.

Provided in accordance with some embodiments of the present invention is a computer program product comprising a computer useable medium having computer program logic recorded thereon. The inventive computer program product is capable of residing in the memory of a computer such as computer 500 shown in FIG. 7. According to typical inventive practice of a computer program product, the computer program logic includes means for enabling access to various information related to the HTS film (e.g., HTS strip 100 or HTS stack 1000) and to the HTS filter (e.g., HTS filter device 300) that includes the HTS film. Depending upon the inventive computer program product embodiment, the accessible information includes any or all of the following: the material composition of the film; the thickness of the film; the total amount of electrical current being conducted by the HTS film during operation of the HTS filter; the temperature to which the HTS film is being cooled during operation of the HTS filter (wherein the operation temperature T of the HTS film is established or determined by a cooling source, such as cryocooler 400, that is associated with the HTS filter); the linear penetration depth of the HTS film during operation of the HTS filter; the gap maximum of the HTS film during operation of the HTS filter; a relationship between the linear penetration depth of the HTS film and the temperature to which the HTS film is being cooled during operation of the HTS filter; a relationship between the gap maximum of the HTS film and the temperature to which the HTS film is being cooled during operation of the HTS filter. Typically, the inventive computer program product further includes means for making at least one determination, based on Expression (3), in furtherance of reducing the intermodulation power of the HTS filter. For instance, an inventive computer program product can determine the optimum value of the operation temperature T, wherein this optimum value is defined as the value of the operation temperature T that minimizes the term $(\lambda_O(T))^{10}(K^{(2)}(T))^2/(\Delta_O(T))^6$ in Expression (3).

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications and changes to the principles disclosed herein may be made by one skilled in the art without departing from the true scope and spirit of the present invention, which is indicated by the following claims.

What is claimed is:

1. A method for designing electronic apparatus that includes superconductor film, the method comprising:

measuring a first pair of values, said first pair of values being a first power $P_{IMD\text{-}1}$ and a first thickness $d_1$, said first power $P_{IMD\text{-}1}$ being the power of intermodulation distortion characterizing a reference electric apparatus, said first thickness $d_1$ being the thickness of superconductor film that said reference electric apparatus includes;

selecting a second pair of values, said second pair of values being a second power $P_{IMD\text{-}2}$ and a second thickness $d_2$, said second power $P_{IMD\text{-}2}$ being a power of intermodulation distortion characterizing a design electric apparatus and being less than said first power $P_{IMD\text{-}1}$, said second thickness $d_2$ being a thickness of superconductor film that said design electric apparatus includes and being greater than said first thickness $d_1$, said selecting of said second pair of values including performing calculation in accordance with the equation $$(P_{IMD\text{-}1})(d_1)^x=(P_{IMD\text{-}2})(d_2)^x,$$

said performing calculation including establishing a value of x between 1.5 and 6.

2. The method for designing electronic apparatus as recited in claim 1, further comprising making said superconductor film that said design electric apparatus includes so as to have said second thickness $d_2$.

3. The method for designing electronic apparatus as recited in claim 1, wherein the established said value of x is 4.

4. A method for designing electronic apparatus that includes superconductor film, the method comprising:

measuring a first pair of values, said first pair of values being a first power $P_{IMD\text{-}1}$ and a first operation temperature $T_1$, said first power $P_{IMD\text{-}1}$ being the power of intermodulation distortion characterizing a reference electric apparatus, said first operation temperature $T_1$ being the unchanged operation temperature T of said superconductor film that said reference electric apparatus includes;

selecting a second pair of values, said second pair of values being a second power $P_{IMD\text{-}2}$ and a second operation temperature $T_2$, said second power $P_{IMD\text{-}2}$ being a power of intermodulation distortion characterizing a design electric apparatus and being less than said first power $P_{IMD\text{-}1}$, said second operation temperature $T_2$ being an operation temperature T of said superconductor film that said design electric apparatus includes and being different from said first operation temperature $T_1$, said selecting of said second pair of values including performing calculation in accordance with the equation $$(P_{IMD\text{-}1})(\Delta_O(T_1))^6(\lambda_O(T_2))^{10}(K^{(2)}(T_2))^2=(P_{IMD\text{-}2})(\Delta_O(T_2))^6(\lambda_O(T_1))^{10}(K^{(2)}(T_1))^2;$$

wherein:

$$K^{(2)}(T)=\frac{q_S^4\alpha\mu^2k_F(\hat{c})}{\pi^3\beta m_{ab}c^2(\hbar c)^2}\sum_{n=-\infty}^{\infty}\int_0^{2\pi}d\theta(\cos^4\theta)(\cos^22\theta)\frac{(\cos^22\theta-(2\hbar\omega_n/\Delta_0(T))^2)}{(\cos^22\theta+(\hbar\omega_n/\Delta_0(T))^2)^{7/2}};$$

$q_s$ is the charge of a single carrier;

$\alpha\approx 2$ is a dimensionless geometrical factor;

$$\beta=1/(k_BT);$$

$k_B$ is the Boltzman constant;

c is the speed of light;

$$\hbar=h/(2\pi);$$

h is Planck's constant;

$$\omega_n=((2n+1)\pi)/(\beta\hbar);$$

n is a positive or negative integer;

$\lambda_O(T)$ is the linear penetration depth at operation temperature T;

$\Delta_O(T)$ is the gap maximum at operation temperature T;

$\mu$ is the Fermi energy;

$k_F(\hat{c})$ is the Fermi momentum in the $\hat{c}$ crystal-axis direction;

$m_{ab}$ is the effective mass in the ab crystal plane.

5. The method for designing electronic apparatus as recited in claim 4, further comprising making said superconductor film that said design electric apparatus includes so as to have said second operation temperature $T_2$.

6. The method for designing electronic apparatus as recited in claim 5, wherein:

said linear penetration depth $\lambda_O$ (T) decreases with decreasing said operation temperature T;

said gap maximum $\Delta_O$ (T) increases with decreasing said operation temperature temperature T;

said kernel $K^{(2)}(T)$ decreases with decreasing said operation temperature T in a first range of said operation temperature T, and increases with decreasing said operation temperature Tin a second range of said operation temperature T.

* * * * *